(12) United States Patent
Zamir et al.

(10) Patent No.: US 11,762,735 B2
(45) Date of Patent: Sep. 19, 2023

(54) INTERLEAVED ECC CODING FOR KEY-VALUE DATA STORAGE DEVICES

(71) Applicant: Western Digital Technologies, Inc., San Jose, CA (US)

(72) Inventors: Ran Zamir, Ramat Gan (IL); David Avraham, Even Yehuda (IL); Alexander Bazarsky, Holon (IL); Eran Sharon, Rishon Lezion (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/492,107

(22) Filed: Oct. 1, 2021

(65) Prior Publication Data

US 2023/0109250 A1 Apr. 6, 2023

(51) Int. Cl.
*G06F 11/10* (2006.01)
*H03M 13/27* (2006.01)
*G06F 16/22* (2019.01)

(52) U.S. Cl.
CPC ...... *G06F 11/1068* (2013.01); *G06F 16/2282* (2019.01); *H03M 13/27* (2013.01)

(58) Field of Classification Search
CPC . G06F 11/1068; G06F 16/2282; H03M 13/27
See application file for complete search history.

(56) References Cited

U.S. PATENT DOCUMENTS

| | | | |
|---|---|---|---|
| 8,266,367 B2 | 9/2012 | Yu et al. | |
| 8,412,879 B2 | 4/2013 | Chang et al. | |
| 10,846,174 B2 | 11/2020 | Lee et al. | |
| 10,871,910 B1 | 12/2020 | Alrod et al. | |
| 10,956,071 B2 * | 3/2021 | Subbarao | ............... G06F 3/064 |
| 11,340,986 B1 * | 5/2022 | Yadav | ............... H03M 13/2906 |
| 2003/0043749 A1 | 3/2003 | Tanaka et al. | |
| 2007/0271493 A1 | 11/2007 | Oh et al. | |
| 2010/0241929 A1 | 9/2010 | Song et al. | |

(Continued)

FOREIGN PATENT DOCUMENTS

WO WO2005036390 * 4/2005 ........... G06F 40/205

OTHER PUBLICATIONS

Jin, Yanqin et al. "KAML: a Flexible, High-Performance Key-Value SSD," IEEE International Symposium on High Performance Computer Architecture 2017 (12 pages).

*Primary Examiner* — Guy J Lamarre
(74) *Attorney, Agent, or Firm* — Michael Best & Friedrich LLP (57) ABSTRACT

Interleaved ECC coding for key-value data storage devices. In one embodiment, a controller includes a memory interface including a namespace database; an ECC engine; a controller memory; and an electronic processor. The electronic processor is configured to receive a host write command, determine whether write access was setup as a key-value (KV) namespace in the namespace database and is associated with the host write command, and control the ECC engine and the memory interface to perform one or more program operations on the data in the memory using the interleaved ECC coding and based on the host write command in response to determining that the write access was setup as the KV namespace in the namespace database and the KV namespace is associated with the host write command.

20 Claims, 7 Drawing Sheets

(56) References Cited

U.S. PATENT DOCUMENTS

| | | | |
|---|---|---|---|
| 2014/0153654 A1 | 6/2014 | Vojcic et al. | |
| 2018/0293174 A1* | 10/2018 | Song | G06F 12/1009 |
| 2018/0358989 A1* | 12/2018 | Mehra | H03M 13/2918 |
| 2019/0004964 A1* | 1/2019 | Kanno | G06F 3/0664 |
| 2020/0042223 A1* | 2/2020 | Li | G11C 29/52 |
| 2020/0174695 A1* | 6/2020 | Bazarsky | G06F 3/0679 |
| 2021/0174224 A1* | 6/2021 | Sharon | G06F 3/0613 |
| 2022/0155965 A1* | 5/2022 | Smith | G06F 3/067 |
| 2022/0179593 A1* | 6/2022 | Benisty | G06F 3/0604 |
| 2022/0359033 A1 | 11/2022 | Iwasaki et al. | |
| 2023/0133361 A1* | 5/2023 | Shilane | G06F 16/2246 |
| | | | 707/664 |

* cited by examiner

INTERLEAVED ECC CODING FOR
KEY-VALUE DATA STORAGE DEVICES

BACKGROUND

This application relates generally to data storage devices and, more particularly, to interleaved ECC coding in data storage devices.

A Key-Value (KV) database stores a quantity of user data that is associated with a key that is addressable as complete entity. For example, the user data may be a photo, a record, or a file. From the host's point-of-view, the photo or the file may be retrieved using a single key/read address rather than multiple read addresses containing the data that makes up the photo. The use of a single key/read address simplifies database management for certain applications, which results in performance increases in these applications.

SUMMARY

The techniques of the present disclosure improve the operation of the KV database described above. Specifically, the KV data storage device of the present disclosure takes advantage of the unique structure of the KV database where each value is written entirely and in order and that each value must be read entirely, or up to some point, but not read from an index. As described in greater detail below, the KV data storage device of the present disclosure advantage of this unique structure to provide better performance, reduced latency, reduced power consumption, and better correction capability, reliability, and endurance of the KV data storage device.

The first advantage of supporting a KV database on the storage device level is the increase in the performance in terms of transfers/second. This advantage occurs for two reasons: 1) the translation layer in the host from key/value to block storage may be removed or is rendered unnecessary, and 2) this removes two layers of mapping and transaction information, which increases the amount of transactions per second, the write amplification, and reduces latency because the commands over the bus are reduced to a single transfer for the entire key value pair. The latency savings from this second reduction is less significant than the savings from removing translation operations that must happen in the host for typical KV database applications.

A second advantage of the KV data storage device of the present disclosure is the simplification and enablement of computational storage (near storage compute). The user data on the KV data storage device is now identifiable as a complete unit as opposed to various pieces that may or may not be contiguous in a normal storage operation.

The disclosure provides a data storage controller including, in one embodiment, a memory interface, an error correction code (ECC) engine, a controller memory, and an electronic processor communicatively connected to the ECC engine and the controller memory. The memory interface is configured to interface with a memory. The error correction code (ECC) engine is configured to perform an interleaved ECC coding on data stored in the memory. The controller memory including a flash translation layer (FTL) and a namespace database. The electronic processor, when executing the FTL, is configured to: receive a host write command, determine whether write access was setup as a key-value (KV) namespace in the namespace database and is associated with the host write command, and control the ECC engine and the memory interface to perform one or more program operations on the data in the memory using the interleaved ECC coding and based on the host write command in response to determining that the write access was setup as the KV namespace in the namespace database and the KV namespace is associated with the host write command.

The disclosure also provides a method. In one embodiment, the method includes receiving, with an electronic processor of a data storage controller, a host write command. The method includes determining, with the electronic processor, whether write access was setup as a key-value (KV) namespace in a namespace database of a controller memory of the data storage controller and the KV namespace is associated with the host write command. The method also includes controlling, with the electronic processor, an error correction code (ECC) engine and a memory interface of the data storage controller to perform one or more program operations on data in a memory coupled to the data storage controller using an interleaved ECC coding and based on the host write command in response to determining that the write access was setup as the KV namespace in the namespace database and the KV namespace is associated with the host write command.

The disclosure also provides a memory device that supports storing data in a key value namespace, the memory device. The memory device includes a controller and a memory coupled to the controller, wherein the controller performs a first ECC coding process that interleaves an ECC code-word with user data when writing the user data to a key-value (KV) database.

In this manner, various aspects of the disclosure provide for improvements in at least the technical fields of data storage devices and their design and architecture. The disclosure can be embodied in various forms, including hardware or circuits controlled by firmware (i.e., code executing on a processor), and computer systems and networks; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware, stored in a non-transitory computer-readable medium, that is executed by processing or control circuitry), or any other suitable means. The following description is intended solely to give a general idea of various aspects of the disclosure, and does not limit the scope of the disclosure in any way.

Figure 1:
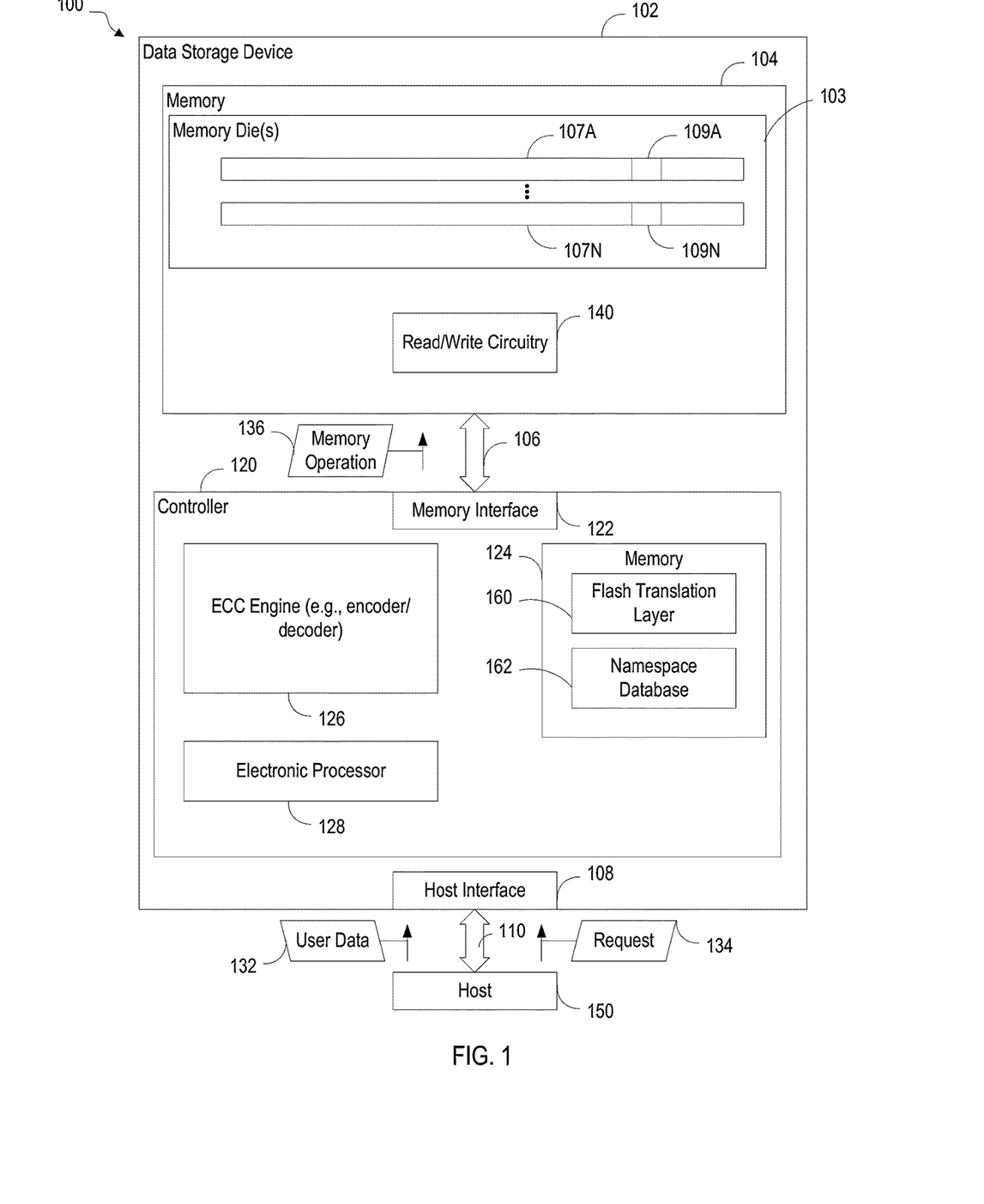
FIG. 1 is block diagram of a system including a data storage device with interleaved ECC coding/decoding, in accordance with some embodiments of the disclosure.

FIG. 1 is block diagram of a system 100 including a data storage device 102 with interleaved ECC coding/decoding, in accordance with some embodiments of the disclosure. In the example of FIG. 1, the system 100 includes the data storage device 102 and a host device 150 (also referred to as "external electronic device"). The data storage device 102 includes a controller 120 and a memory 104 (e.g., non-volatile memory) that is coupled to the controller 120.

One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The data storage device 102 and the host device 150 may be operationally coupled with a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 with the communication path 110, such as a wired communication path and/or a wireless communication path. For example, the data storage device 102 may include an interface 108 (e.g., a host interface) that enables communication with the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests 134 to erase data at, read data from, or write data to the memory 104 of the data storage device 102. For example, the one or more requests 134 may include a key-value (KV) or read address associated with user data 132, where the user data 132 is an entire photo, entire record, or an entire file. Additionally, the host device 150 may be configured to provide data, such as the user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates with a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NAND, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (e.g., one or more erase blocks). Each block may include one or more groups of storage elements, such as a representative group of storage elements 107A-107N. The group of storage elements 107A-107N may be configured as a word line. The group of storage elements 107 may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) with a bus 106 and a memory interface 122 (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150 with the memory interface 122. For example, the controller 120 may send data to the host device 150 with the interface 108, and the controller 120 may receive data from the host device 150 with the interface 108.

The controller 120 is configured to send data and commands (e.g., the memory operation 136) to the memory 104 with the memory interface 122. For example, the controller 120 is configured to send data and a write command to cause the memory 104 to store data to a specified address of the memory 104 with the memory interface 122. The write command may specify a physical address of a portion of the memory 104 (e.g., a physical address of a word line of the memory 104) that is to store the data.

The controller 120 is configured to send a read command to the memory 104 to access data from a specified address of the memory 104 with the memory interface 122. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations with the memory interface 122.

The controller 120 may include a memory 124, an error correction code (ECC) engine 126, and the processor 128. The memory 124 may be configured to store data and/or instructions that may be executable by the processor 128. The memory 124 may include flash translation layer 160 and a namespace database 162. The flash translation layer 160 may be a hardware circuit or instructions that are executable by the processor 128. The flash translation layer 160 may cause the processor 128 to set up namespaces (i.e., Key-Value (KV) namespaces and Block IO namespaces) in the namespace database 162 that are associated with different physical regions of the memory 104. In some examples, the host device 150 includes a command in the request 134 to cause the processor 128 to set up namespaces including KV namespaces and block IO namespaces. In other examples, the flash translation layer 160 may cause the processor 128 to set up namespaces including KV namespaces and block IO namespaces in response to receiving keys in the request 134 from the host device 150.

The KV namespaces represent a KV database in the data storage device 102 and each KV namespace includes a key associated with an amount of data across a plurality of addresses and the data is indexed according to this key. Each Block IO namespace includes a logical address range and the host device 150 may access any address in the logical address range.

The flash translation layer 160 may also select or generate one of the KV namespaces or the Block IO namespaces based on one of the request 134 and a size the user data 132. For example, when the request 134 includes a key and the size of the user data 132 is equal to or above a threshold (e.g., 4 KB), the flash translation layer 160 generates (when the key is new) or selects (when the key has been previously seen) one of the KV namespaces that is associated with the key. Alternatively, when the request 134 includes a key and the size of the user data 132 is below a threshold (e.g., 4 KB), the flash translation layer 160 generates (when the key is new) or selects (when the key has been previously seen) one of the Block IO namespaces that is associated with the key and a single address. Further, when the request 134 includes a single address, the flash translation layer 160 generates (when the address is new) or selects (when the address has been previously seen) one of the Block IO namespaces that is associated with the address.

Upon generating or selecting one of the KV namespaces or the Block IO namespaces, the flash translation layer 160 may control the ECC engine 126 to perform ECC coding/decoding with the memory operation 136 and the memory interface 122, and based on the selected namespace and the user data 132. In some examples, the ECC engine 126 may perform interleaved ECC coding/decoding with the memory operation 136 based on a selection of a key-value (KV) namespace that is referred to herein as "interleaved ECC coding/decoding" and is described in greater detail below with respect to FIGS. 3-9. Additionally, in these examples, the ECC engine 126 may also perform page-by-page ECC coding/decoding with the memory operation 136 based on a selection of a Block IO namespace that is referred to herein as "hybrid ECC coding/decoding" and is described in greater detail below with respect to FIGS. 6-9. The hybrid ECC coding/decoding includes both interleaved ECC coding/decoding and page-by-page ECC coding/decoding. Further, in some examples, an application or circuitry separate and distinct from any application stored in the memory 124 may control the ECC engine 126 to perform interleaved or hybrid ECC coding/decoding as described herein.

Figure 2:
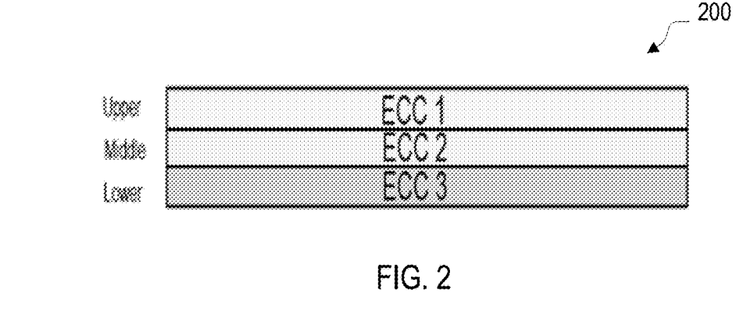
FIG. 2 is a diagram illustrating a first example of non-interleaved ECC coding.

FIG. 2 is a diagram illustrating a first example 200 of page-by-page ECC coding. As illustrated in the first example 200, each ECC code word, i.e., ECC 1, ECC 2, and ECC 3 is stored on a different logical page, i.e., Upper, Middle, and Lower logical pages, respectively. In the first example 200, each ECC code-word may be decoded by sensing/reading only one of the logical pages.

Figure 3:
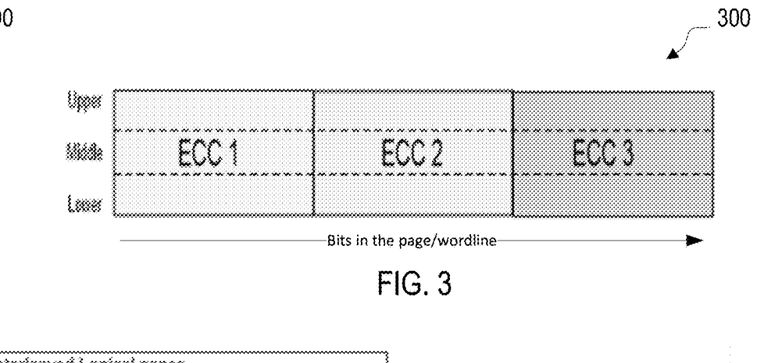
FIG. 3 is a diagram illustrating a second example of non-interleaved ECC coding.

FIG. 3 is a diagram illustrating a second example 300 of interleaved ECC coding. As illustrated in the second example 300, each ECC code word, i.e., ECC 1, ECC 2, and ECC 3, is spanned across all logical pages, i.e., Upper, Middle, and Lower logical pages, of the wordline. In the second example 300, decoding of an ECC code-word requires sensing/reading of all the logical pages.

Figure 4:
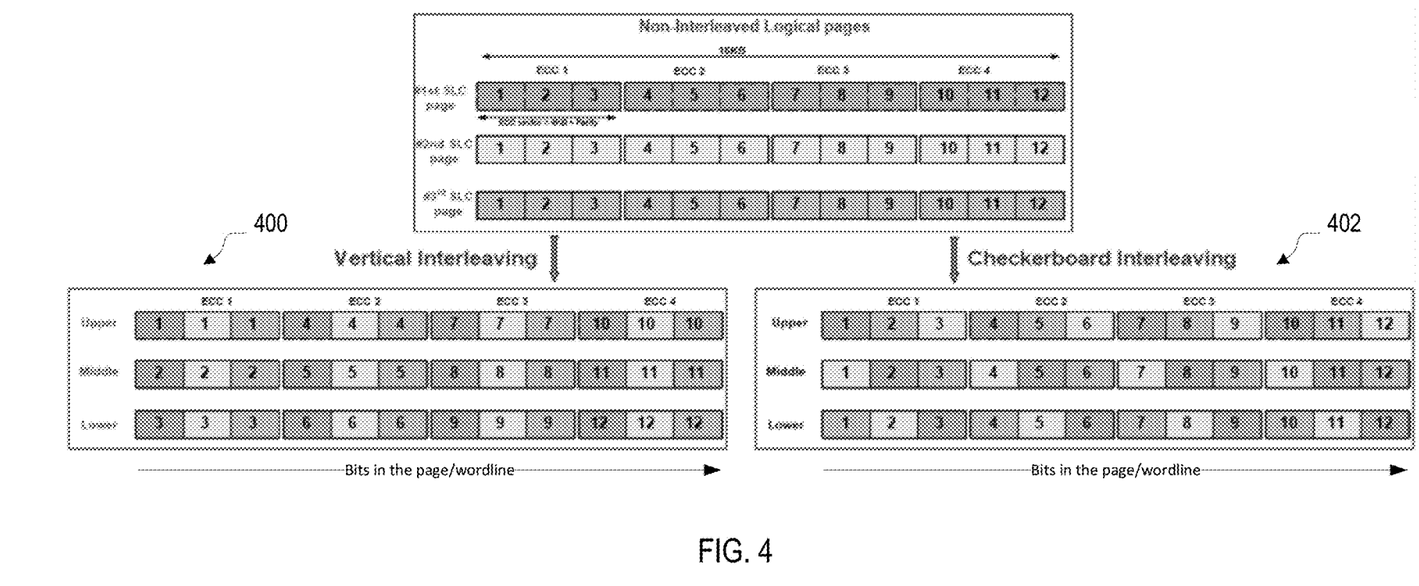
FIG. 4 is a diagram illustrating two additional examples of interleaved ECC coding.

FIG. 4 is a diagram illustrating two additional examples 400 and 402 of interleaved ECC coding. As illustrated in FIG. 4, the example 400 is an example of vertical interleaving across logical pages (i.e., Upper, Middle, and Lower logical pages) of the wordline, where the ECC codeword is broken up and vertically aligned across the logical pages of the same word line. Similarly, as illustrated in FIG. 4, the example 402 is an example of checkerboard interleaving across logical pages (i.e., Upper, Middle, and Lower logical pages) of the wordline, where the ECC codeword is broken up and diagonally aligned across the logical pages of the same word line.

The interleaved ECC coding as described herein is not limited to the above examples 300, 400, and 402. Other interleaving options may be implemented in place of, or in addition to, the above examples 300, 400, and 402.

There are a several advantages of interleaved ECC coding over non-interleaved ECC coding. First, interleaved ECC coding allows for bit error rate (BER) averaging within an ECC code-word and significantly higher robustness to page-to-page BER variations. This is very useful for NAND flash, where each logical page usually exhibits a different error distribution. Second, the state information is available for the ECC decoder and may be initialized with more informative log-likelihood-ratios (LLRs). Further, other logical pages may serve as virtual soft bits for "free," i.e., using the existing data, without the need for additional senses/reads from the NAND.

Figure 5:
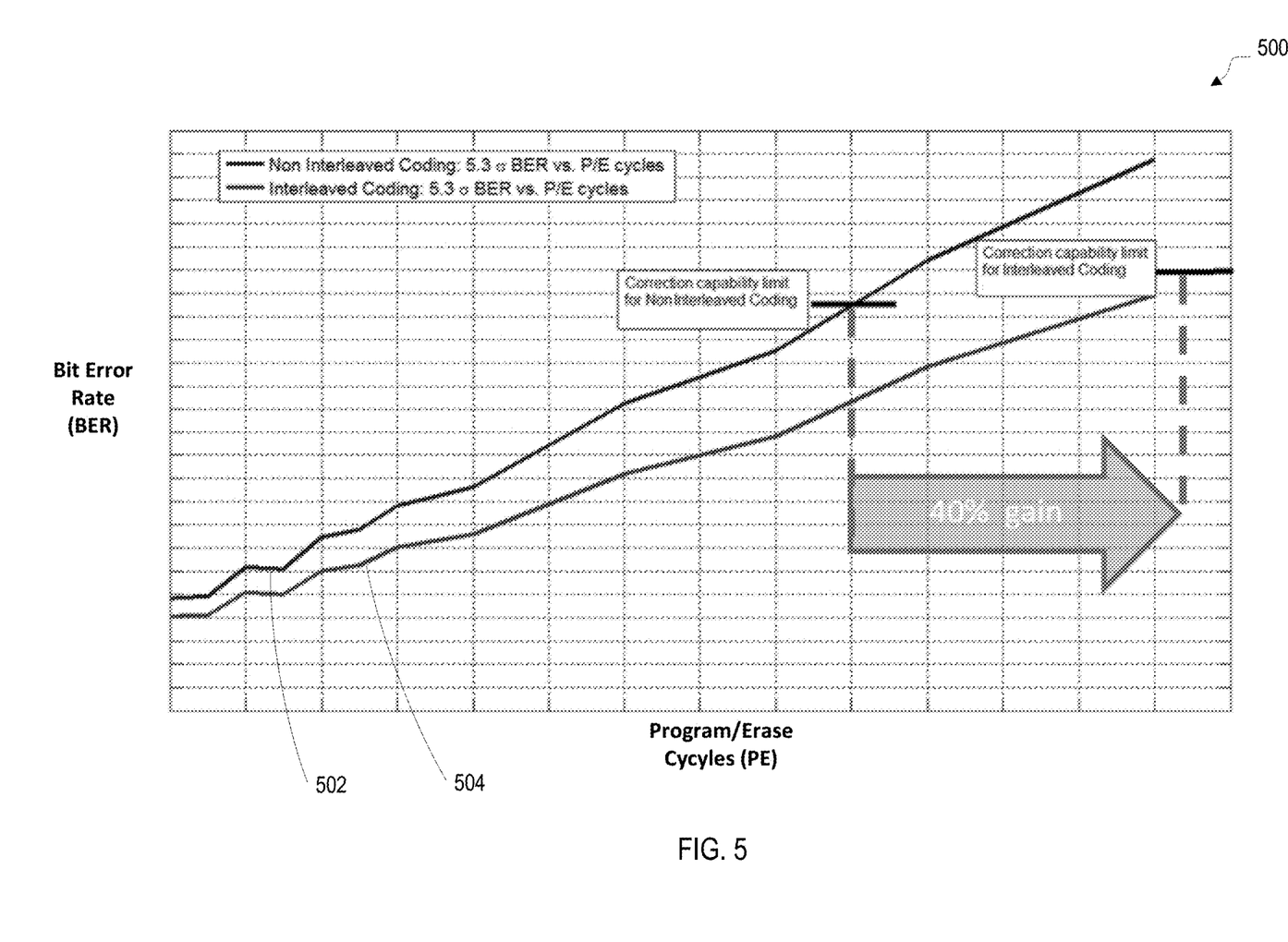
FIG. 5 is a graph illustrating an example of the bit error rate (BER) comparison between a non-interleaved ECC coding system and an interleaved ECC coding system as a function of the amount of program/erase cycles, in accordance with various aspects of the present disclosure.

FIG. 5 is a graph illustrating an example of the bit error rate (BER) comparison 500 between a non-interleaved ECC coding system and an interleaved ECC coding system as a function of the amount of program/erase cycles, in accordance with various aspects of the present disclosure. As illustrated in FIG. 5, a 5-sigma bit error rate (BER) representing the worst case BER is much lower in the interleaved ECC coding system (BER 504) than the non-interleaved ECC coding system (BER 502). In fact, the difference between the BER 502 and the BER 504 is approximately a 40% gain to the endurance of the interleaved ECC coding system. The reduced BER 504 of the interleaved system also improves the throughput, the power consumption, the Quality of Service (QoS), and the endurance (e.g., the amount of program/erase cycles the data storage device 100 can support) of the interleaved ECC coding system.

Key-value entries in terms of dedicated namespaces may setup by the host (e.g., the host device 150) or by the data storage device. The properties of the dedicated namespace are defined through an interface called Key-Value (KV) format. The KV format also defines the length of values. The present disclosure dedicates coding types for each type namespace: 1) interleaved ECC coding for KV namespaces and 2) normal page-by-page ECC mapping for normal block JO namespaces. For example, when the value length of the KV format is 4 KB or below (like a regular flash memory unit (FMU)), then the value may be treated as a normal block JO namespace as the value is not expected to get benefit of long values in the KV namespace.

The KV namespace has special write and read properties. Specifically, KV namespaces are written at once and in order. Likewise, KV namespaces are also read in order starting from the beginning of the "value." These special write and read properties make KV namespaces a perfect fit for interleaved ECC coding as described above with respect to FIG. 4. Consequently, in some examples, a Key-Value (KV) data storage device (e.g., the data storage device 102) may simply use interleaved ECC coding/decoding in every instance. However, while interleaving data during the write is easier than during the read because the data is read in order, the biggest caveat of interleaved ECC coding is a degradation of small random reads.

To overcome this caveat of interleaved ECC coding, a flash translation layer (FTL) of the present disclosure (e.g., the flash translation layer 160) may manage two types of ECC coding schemes in the storage system: 1) an interleaved ECC coding for the KV namespaces, and 2) a page-by-page ECC coding for the block IO namespaces. The exact type to be used may be determined according to the namespaces setup by the host (e.g., the host device 150) or by the data storage device (e.g., the data storage device 102).

Additionally, in some examples, the flash translation layer 160 further manages the interleaved ECC coding for the KV namespaces and the page-by-page ECC coding for the block JO namespaces based on key-value (KV) value size. In these examples, the flash translation layer 160 uses interleaved ECC coding for only KV values with a size greater than a predetermined threshold (e.g., four kilobytes). In other words, the flash translation layer 160 may use interleaved ECC coding for only "large" KV values and may use page-by-page coding for everything else.

For normal block IO namespaces, the FTL uses page-by-page ECC coding similar to legacy systems. For KV namespaces, which have the special characteristics and limitations that are suitable for interleaved coding, the FTL uses interleaved ECC coding. As described above, enabling interleaved ECC coding substantially improves all aspects of the ECC engine 126 including performance, power, and most of all reliability because reliability is governed by the worst page and the interleaved ECC coding interleaves the ECC code word across a plurality of pages.

Figure 6:
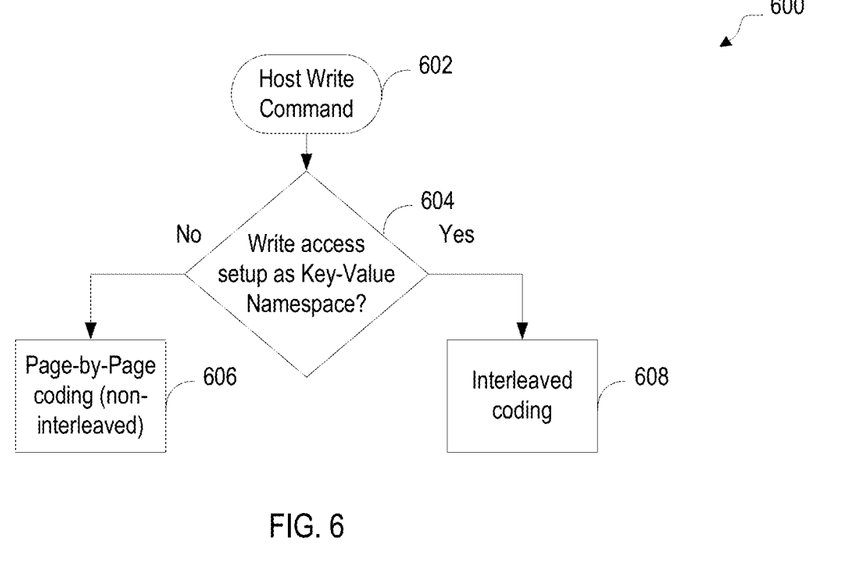
FIG. 6 is a flowchart illustrating a host write coding determination process, in accordance with various aspects of the present disclosure.

FIG. 6 is a flowchart illustrating a host write coding determination process 600, in accordance with various aspects of the present disclosure. FIG. 6 is described with respect to the controller 120 of FIG. 1.

As illustrated in FIG. 6, the host write coding determination process 600 includes the controller 120 receiving a host write (at block 602). The host write coding determination process 600 includes the controller 120 determining whether write access was setup as a Key-Value (KV) namespace in the namespace database 162 (at decision block 604).

In response to determining that the write access was not setup as the KV namespace in the namespace database 162 ("No" at decision block 604), the host write coding determination process 600 includes the controller 120 performs page-by-page ECC coding (non-interleaved) (at block 606). In response to determining that the write access was setup as the KV namespace in the namespace database 162 ("Yes" at decision block 604), the host write coding determination process 600 includes the controller 120 performs interleaved ECC coding (at block 608).

In some examples, the KV namespace may be previously set up by the host device 150. In other examples, the KV namespace may be setup by the controller 120.

Figure 7:
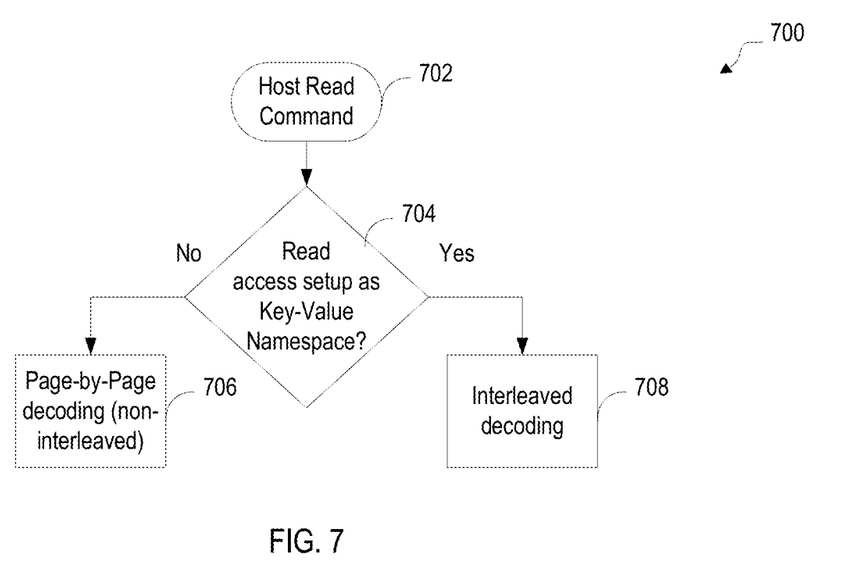
FIG. 7 is a flowchart illustrating a host read coding determination process, in accordance with various aspects of the present disclosure.

FIG. 7 is a flowchart illustrating a host read coding determination process 700, in accordance with various aspects of the present disclosure. FIG. 7 is described with respect to the controller 120 of FIG. 1. The coding type was determined during the write. Therefore, during the host read coding determination process 700, the controller 120 follows the same decision made during the write process described above in FIG. 6.

As illustrated in FIG. 7, the host read coding determination process 700 includes the controller 120 receiving a host read (at block 702). The host read coding determination process 700 includes the controller 120 determining whether read access was setup as a Key-Value (KV) namespace in the namespace database 162 (at decision block 704).

In response to determining that the read access was not setup as the KV namespace in the namespace database 162 ("No" at decision block 704), the host read coding determination process 700 also includes the controller 120 performing page-by-page ECC decoding (non-interleaved) (at block 706). In response to determining that the read access was setup as the KV namespace in the namespace database 162 ("Yes" at decision block 704), the host read coding determination process 700 also includes the controller 120 performing interleaved ECC decoding (at block 708).

In some examples, the KV namespace may be previously set up by the host device 150. In other examples, the KV namespace may be previously set up by the controller 120.

Figure 8:
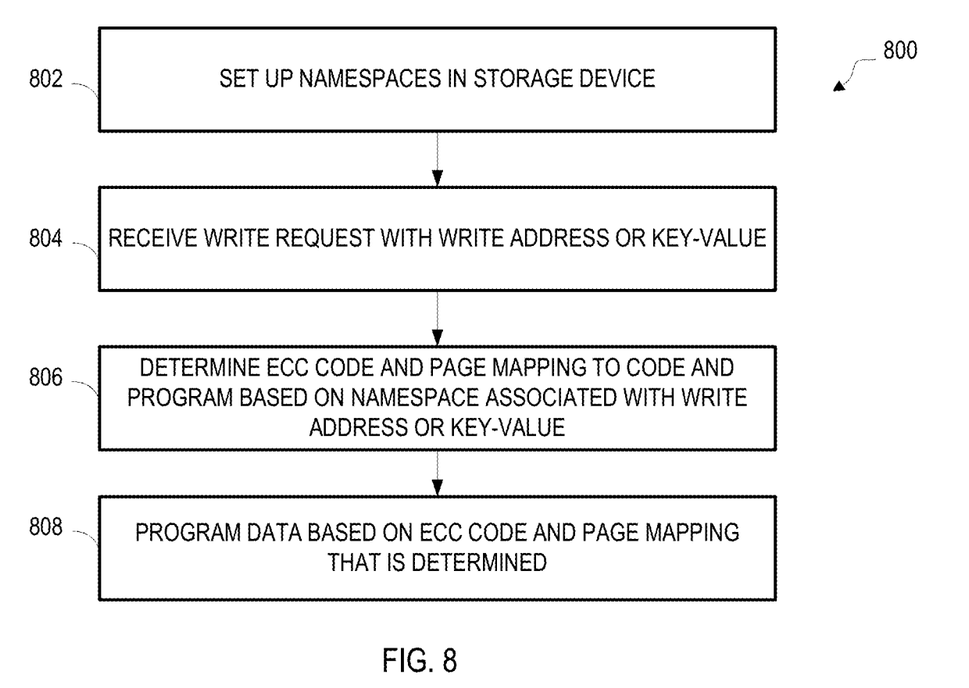
FIG. 8 is a flowchart illustrating a host write process, in accordance with various aspects of the present disclosure.

FIG. 8 is a flowchart illustrating a host write process 800, in accordance with various aspects of the present disclosure. FIG. 8 is described with respect to the controller 120 of FIG.

1. However, FIG. 8 is equally applicable to the host device 150 controlling the controller 120 of FIG. 1 to perform the host write process 800.

The host write process 800 includes setting up namespaces in a data storage device (at block 802). For example, the controller 120 sets up namespaces in the namespace database 162, the namespaces separated into KV namespaces and Block IO namespaces.

The host write process 800 includes receiving a write request with a write address or key-value (at block 804). For example, the controller 120 receives a write request with a write address or key-value from the host device 150. In some examples, the write request includes a namespace identifier (ID) that identifies whether the write request is associated with a KV namespace or a Block-IO namespace.

The host write process 800 includes determining an ECC code and Page mapping to code and program based on a namespace associated with the write address or the key-value (at block 806). For example, the controller 120 determines whether to perform page-by-page ECC coding or interleaved ECC coding based on a namespace in the namespace 162 associated with the write address or the key-value, the write address or the key-value is associated with a KV namespace or a Block IO namespace.

The host write process 800 includes programming data based on the ECC code and Page mapping that is determined (at block 808). For example, the controller 120 programs data to a plurality of memory addresses in the memory 104 with the interleaved ECC coding that is determined. Alternatively, for example, the controller 120 programs data to a memory address in the memory 104 with the page-by-page ECC coding that is determined.

Figure 9:
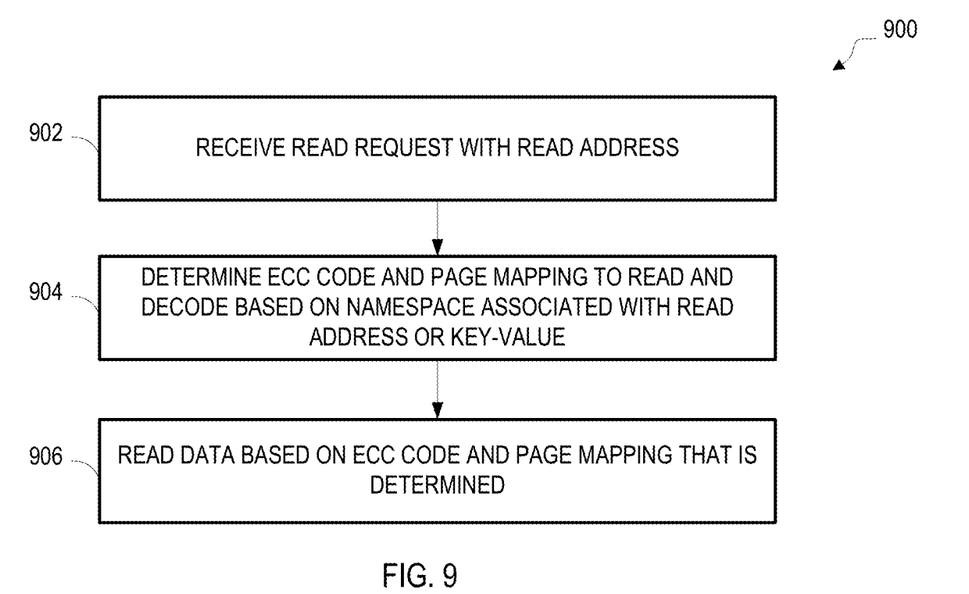
FIG. 9 is a flowchart illustrating a host read process, in accordance with various aspects of the present disclosure.

FIG. 9 is a flowchart illustrating a host read process 900, in accordance with various aspects of the present disclosure. FIG. 9 is described with respect to the controller 120 of FIG. 1. However, FIG. 9 is equally applicable to the host device 150 controlling the controller 120 of FIG. 1 to perform the host read process 900.

The host read process 900 includes receiving a read request with a key or a read address (at block 902). For example, the controller 120 receives a read request with a read address from the host device 150, and the read address is associated with a KV namespace or a Block IO namespace. Alternatively, for example, the controller 120 receives a read request with a key from the host device 150, and the key is associated with a KV namespace. In some examples, the read request includes a namespace identifier (ID) that identifies whether the read request is associated with a KV namespace or a Block-IO namespace.

The host read process 900 includes determining an ECC code and Page mapping to read and decode based on the namespace associated with the read address (at block 904). For example, the controller 120 determines whether to perform page-by-page ECC decoding or interleaved ECC decoding based on the namespace associated with the read address.

The host read process 900 includes reading data based on the ECC code and Page mapping that is determined (at block 906). For example, the controller 120 reads data from a plurality of memory addresses by performing interleaved ECC decoding in response to determining that the namespace associated with the read address is a KV namespace. Alternatively, the controller 120 reads data from a memory address by performing page-by-page ECC decoding in response to determining that the namespace associated with the read address is a Block IO namespace.

Figure 10:
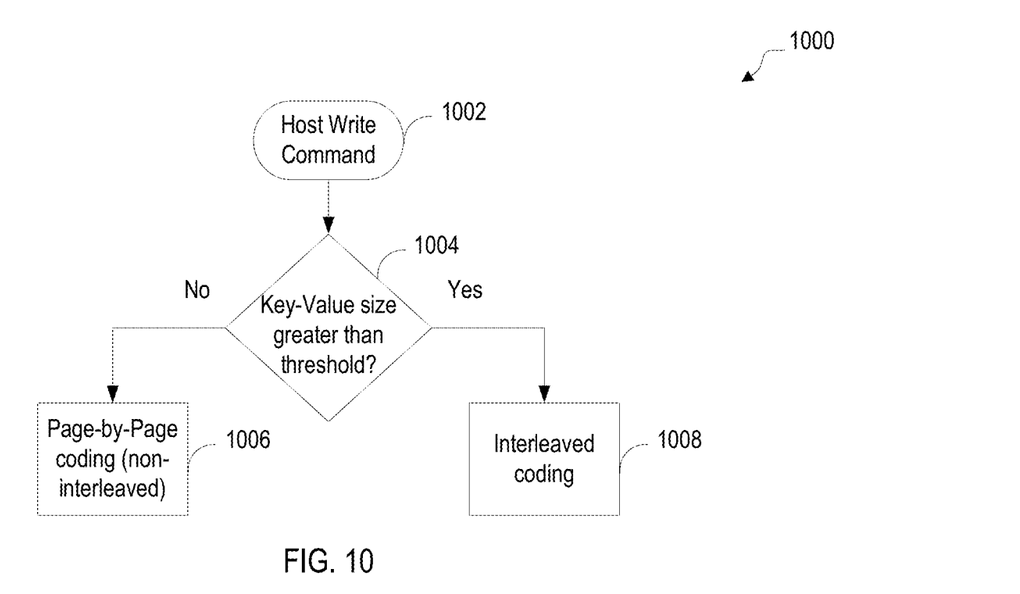
FIG. 10 is a flowchart illustrating a second host write coding determination process, in accordance with various aspects of the present disclosure.

FIG. 10 is a flowchart illustrating a second host write coding determination process 1000, in accordance with various aspects of the present disclosure. FIG. 10 is described with respect to the controller 120 of FIG. 1.

As illustrated in FIG. 10, the second host write coding determination process 1000 includes the controller 120 receiving a host write (at block 1002). The second host write coding determination process 1000 includes the controller 120 determining whether a Key-Value (KV) size is greater than a threshold (e.g., four kilobytes)(at decision block 1004). In response to determining that the Key-Value (KV) size is not greater than the threshold ("No" at decision block 1004), the second host write coding determination process 1000 includes the controller 120 performs page-by-page ECC coding (non-interleaved) (at block 1006). In response to determining that the Key-Value (KV) size is equal to or greater than the threshold ("Yes" at decision block 1004), the second host write coding determination process 1000 includes the controller 120 performs interleaved ECC coding (at block 1008).

In some examples, the threshold is a size of flash memory unit (FMU). In other examples, the threshold is different from the size of the FMU.

Figure 11:
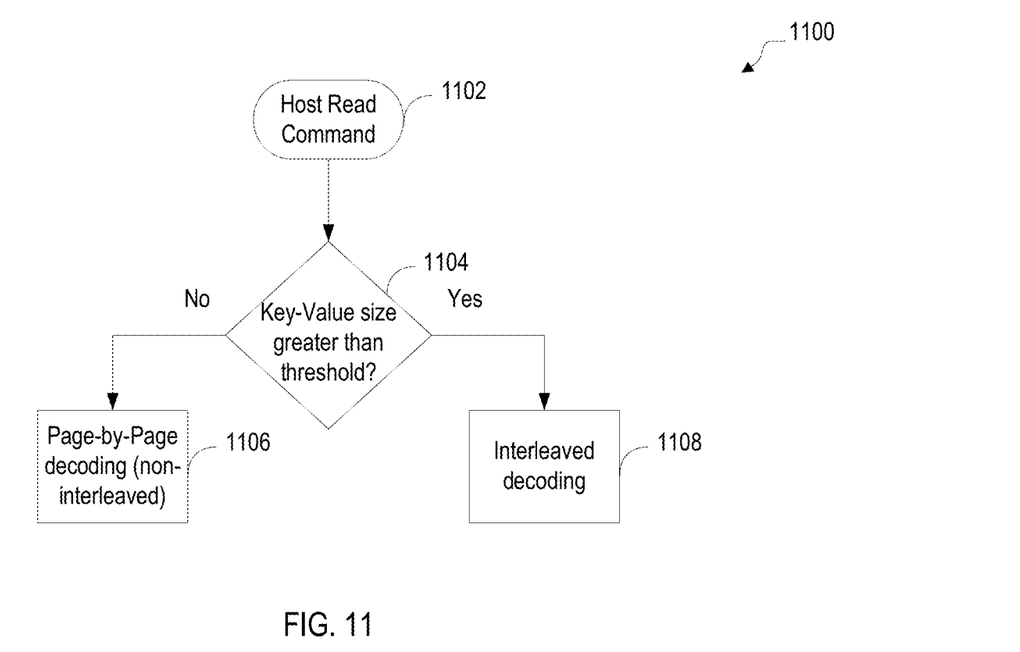
FIG. 11 is a flowchart illustrating a second host read coding determination process, in accordance with various aspects of the present disclosure.

FIG. 11 is a flowchart illustrating a second host read coding determination process 1100, in accordance with various aspects of the present disclosure. FIG. 11 is described with respect to the controller 120 of FIG. 1.

As illustrated in FIG. 11, the second host read coding determination process 1100 includes the controller 120 receiving a host read (at block 1102). The second host read coding determination process 1100 includes the controller 120 determining whether a Key-Value (KV) size is greater than a threshold (e.g., four kilobytes) (at decision block 1104). In response to determining the Key-Value (KV) size is not greater than the threshold (e.g., four kilobytes) ("No" at decision block 1104), the second host read coding determination process 1100 includes the controller 120 performing page-by-page ECC decoding (non-interleaved) (at block 1106). In response to determining the Key-Value (KV) size is greater than the threshold (e.g., four kilobytes) ("Yes" at decision block 1104), the second host read coding determination process 1100 also includes the controller 120 performing interleaved ECC decoding (at block 1108).

In some examples, the threshold is a size of flash memory unit (FMU). In other examples, the threshold is different from the size of the FMU.

Figure 12:
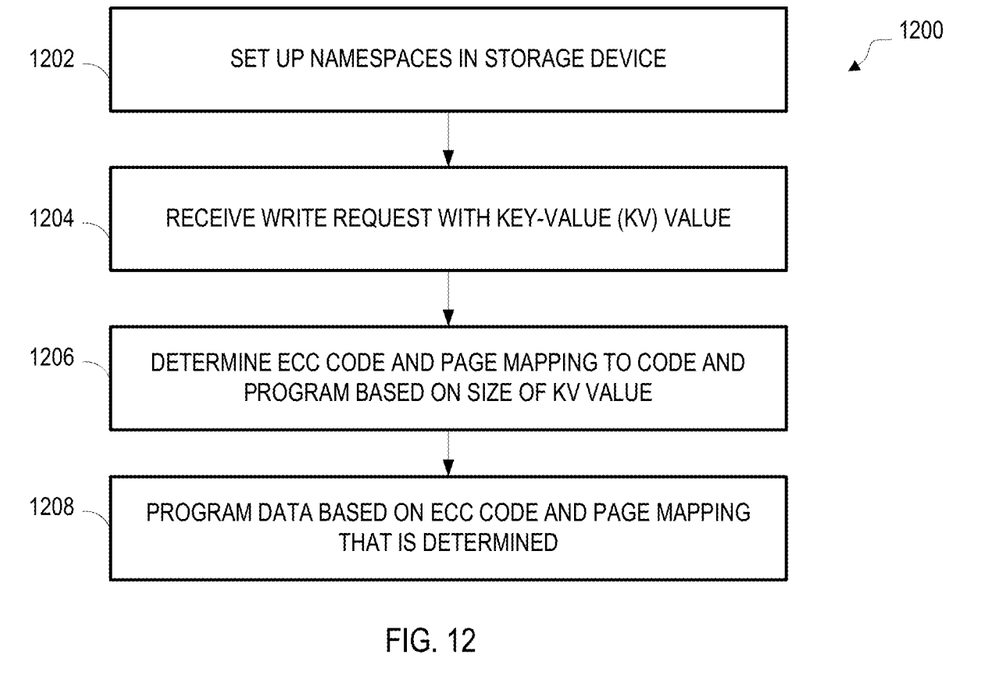
FIG. 12 is a flowchart illustrating a second host write process, in accordance with various aspects of the present disclosure.

FIG. 12 is a flowchart illustrating a second host write process 1200, in accordance with various aspects of the present disclosure. FIG. 12 is described with respect to the controller 120 of FIG. 1. However, FIG. 12 is equally applicable to the host device 150 controlling the controller 120 of FIG. 1 to perform the second host write process 1200.

The second host write process 1200 includes setting up namespaces in a data storage device (at block 1202). For example, the controller 120 sets up namespaces in the namespace database 162, the namespaces separated into KV namespaces and Block IO namespaces.

The second host write process 1200 includes receiving a write request with a key-value (at block 1204). For example, the controller 120 receives a key-value (KV) value from the host device 150. In some examples, the write request includes a namespace identifier (ID) that identifies whether the write request is associated with a KV namespace or a Block-IO namespace.

The second host write process 1200 includes determining an ECC code and Page mapping to code and program based on a size of the KV value (at block 1206). For example, the controller 120 determines whether to perform page-by-page ECC coding or interleaved ECC coding based on a size associated with the KV value.

The second host write process 1200 includes programming data based on the ECC code and Page mapping that is determined (at block 1208). For example, the controller 120 programs data to a plurality of memory addresses in the memory 104 with the interleaved ECC coding that is determined. Alternatively, for example, the controller 120 programs data to a memory address in the memory 104 with the page-by-page ECC coding that is determined.

Figure 13:
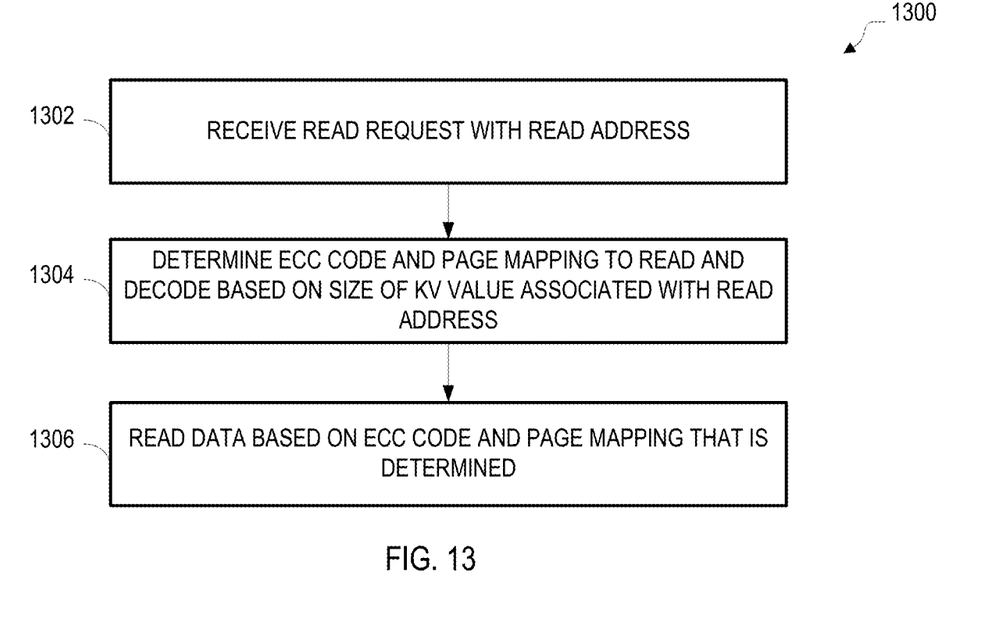
FIG. 13 is a flowchart illustrating a second host read process, in accordance with various aspects of the present disclosure.

FIG. 13 is a flowchart illustrating a second host read process 1300, in accordance with various aspects of the present disclosure. FIG. 13 is described with respect to the controller 120 of FIG. 1. However, FIG. 13 is equally applicable to the host device 150 controlling the controller 120 of FIG. 1 to perform the second host read process 1300.

The second host read process 1300 includes receiving a read request with a read address (or a key-value) (at block 1302). For example, the controller 120 receives a read request with a read address from the host device 150, and the read address is associated with a key-value (KV) value and a KV namespace or a KV value and a Block IO namespace.

The second host read process 1300 includes determining an ECC code and Page mapping to read and decode based on a size of the KV value associated with the read address (at block 1304). For example, the controller 120 determines whether to perform page-by-page ECC decoding or interleaved ECC decoding based on a size of the KV value associated with the read address.

The second host read process 1300 includes reading data based on the ECC code and Page mapping that is determined (at block 1306). For example, the controller 120 reads data from a plurality of memory addresses by performing interleaved ECC decoding in response to determining that the size of the KV value associated with the read address is greater than a threshold. Alternatively, the controller 120 reads data from a memory address by performing page-by-page ECC decoding in response to determining that the size of the KV value associated with the read address is not greater than a threshold.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage controller, comprising:
    a memory interface configured to interface with a memory;
    an error correction code (ECC) engine configured to perform an interleaved ECC coding on data stored in the memory;
    a controller memory including a flash translation layer (FTL) and a namespace database; and
    an electronic processor communicatively connected to the ECC engine and the controller memory, the electronic processor, when executing the FTL, is configured to:
        receive a host write command,
        determine whether write access was setup as a key-value (KV) namespace in the namespace database and is associated with the host write command, and
        control the ECC engine and the memory interface to perform one or more program operations on the data in the memory using the interleaved ECC coding and based on the host write command in response to determining that the write access was setup as the KV namespace in the namespace database and the KV namespace is associated with the host write command.

2. The data storage controller of claim 1, wherein the ECC engine is configured to perform a page-by-page ECC coding on the data in the memory, and
    wherein the electronic processor, when executing the FTL, is further configured to:
        control the ECC engine and the memory interface to perform a second one or more program operations on the data in the memory using the page-by-page ECC coding and based on the host write command in response to determining that the write access was not setup as the KV namespace in the namespace database.

3. The data storage controller of claim 1, wherein the ECC engine is configured to:
    perform an interleaved ECC decoding on the data in the memory, and
    perform a page-by-page ECC decoding on the data in the memory, and wherein the electronic processor, when executing the FTL, is further configured to:
receive a host read command,
determine whether read access was setup as the KV namespace in the namespace database and is associated with the host read command, and
control the ECC engine and the memory interface to perform one or more read operations on the data in the memory using the interleaved ECC decoding and based on the host read command in response to determining that the read access was setup as the KV namespace in the namespace database and is the KV namespace associated with the host read command.

4. The data storage controller of claim 3, wherein the electronic processor, when executing the FTL, is further configured to:
control the ECC engine and the memory interface to perform a second one or more read operations on the data in the memory using the page-by-page ECC decoding and based on the host read command in response to determining that the read access was not setup as the KV namespace in the namespace database.

5. The data storage controller of claim 1, wherein the electronic processor, when executing the FTL, is further configured to:
receive one or more namespaces from an external electronic device, the one or more namespaces including the KV namespace that is associated with the host write command, and
control the memory to store the one or more namespaces in the namespace database.

6. The data storage controller of claim 1, wherein the host write command includes user data and a request, the request including one of a key-value, a write address, or a namespace identifier, and wherein the interleaved ECC coding is one of a vertical interleaved ECC coding or a checkerboard interleaved ECC coding.

7. The data storage controller of claim 6, wherein the ECC engine is configured to perform a page-by-page ECC coding on the user data stored in the memory, and
wherein the electronic processor, when executing the FTL, is further configured to:
determine whether a size of the user data is greater than a threshold, and
control the ECC engine and the memory interface to perform a second one or more program operations on the user data using the page-by-page ECC decoding and based on the host write command in response to determining that the size of the user data is not greater than the threshold.

8. A method comprising:
receiving, with an electronic processor of a data storage controller, a host write command;
determining, with the electronic processor, whether write access was setup as a key-value (KV) namespace in a namespace database of a controller memory of the data storage controller and the KV namespace is associated with the host write command; and
controlling, with the electronic processor, an error correction code (ECC) engine and a memory interface of the data storage controller to perform one or more program operations on data in a memory coupled to the data storage controller using an interleaved ECC coding and based on the host write command in response to determining that the write access was setup as the KV namespace in the namespace database and the KV namespace is associated with the host write command.

9. The method of claim 8, further comprising:
controlling the ECC engine and the memory interface to perform a second one or more program operations on the memory using a page-by-page ECC coding and based on the host write in response to determining that the write access was not setup as the KV namespace in the namespace database.

10. The method of claim 8, further comprising:
receiving a host read;
determining whether read access was setup as the KV namespace in the namespace database and the KV namespace is associated with the host read; and
controlling the ECC engine and the memory interface to perform one or more read operations on the data in the memory using the interleaved ECC decoding and based on the host read in response to determining that the read access was setup as the KV namespace in the namespace database and the KV namespace is associated with the host read.

11. The method of claim 10, further comprising:
controlling the ECC engine and the memory interface to perform a second one or more read operations on the memory using a page-by-page ECC decoding and based on the host read in response to determining that the read access was not setup as the KV namespace in the namespace database.

12. The method of claim 8, further comprising:
receiving one or more namespaces from an external electronic device, the one or more namespaces including the KV namespace that is associated with the host write; and
controlling the memory to store the one or more namespaces in the namespace database.

13. The method of claim 8, wherein the host write includes user data and a request, the request including one of a key-value or a write address, and wherein the interleaved ECC coding is one of a vertical interleaved ECC coding or a checkerboard interleaved ECC coding.

14. The method of claim 13, further comprising:
determining whether a size of the user data is greater than a threshold; and
controlling the ECC engine and the memory interface to perform a second one or more program operations on the data in the memory using a page-by-page ECC decoding and based on the host write in response to determining that the size of the user data is not greater than the threshold,
wherein the second one or more program operations are performed instead of the one or more program operations.

15. A memory device that supports storing data in a key value namespace, the memory device comprising:
a controller; and
a memory coupled to the controller, wherein the controller performs a first ECC coding process that interleaves an ECC code-word with user data when writing the user data to a key-value (KV) database.

16. The memory device of claim 15, wherein the controller performs a second ECC coding process that performs page-by-page ECC coding of the user data writing the ECC code-word and the user data page-by-page in the memory.

17. The memory device claim 16, wherein the controller manages the first and second ECC coding processes using a Flash-Translation-Layer (FTL) and a namespace database.

18. The memory device of claim 17, wherein the controller includes a controller memory for storing the FTL and the namespace database.

19. The memory device of claim 15, wherein the memory comprises a plurality of NAND dies.

20. The memory device of claim 15, wherein a host write command received by the controller from a host device includes the user data and a request, the request including one of a key-value or a write address, and wherein the first ECC coding process is one of a vertical interleaved ECC coding or a checkerboard interleaved ECC coding of the ECC code-word with the user data in the memory.

* * * * *